United States Patent
Al-Qadasi et al.

(10) Patent No.: US 11,705,919 B2
(45) Date of Patent: Jul. 18, 2023

(54) SUCCESSIVE APPROXIMATION TREE CONFIGURATION FOR ANALOG-TO-DIGITAL CONVERTER

(71) Applicant: KING ABDULLAH UNIVERSITY OF SCIENCE AND TECHNOLOGY, Thuwal (SA)

(72) Inventors: Mohammed Ali Al-Qadasi, Thuwal (SA); Abdullah Ali Alshehri, Thuwal (SA); Hossein Fariborzi, Thuwal (SA); Talal Al-Attar, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 66 days.

(21) Appl. No.: 17/439,516

(22) PCT Filed: Mar. 2, 2020

(86) PCT No.: PCT/IB2020/051758
§ 371 (c)(1),
(2) Date: Sep. 15, 2021

(87) PCT Pub. No.: WO2020/201850
PCT Pub. Date: Oct. 8, 2020

(65) Prior Publication Data
US 2022/0158650 A1     May 19, 2022

Related U.S. Application Data

(60) Provisional application No. 62/932,083, filed on Nov. 7, 2019, provisional application No. 62/829,147, filed on Apr. 4, 2019.

(51) Int. Cl.
*H03M 1/36* (2006.01)
*H03M 1/00* (2006.01)

(52) U.S. Cl.
CPC ............ *H03M 1/361* (2013.01); *H03M 1/002* (2013.01)

(58) Field of Classification Search
CPC ............................. H03M 1/361; H03M 1/002
(Continued)

(56) References Cited

U.S. PATENT DOCUMENTS 3,737,894 A * 6/1973 Poretti .................... H03M 1/00
                                                            341/159
7,656,340 B2 * 2/2010 Gribok .................. H03M 1/002
                                                            341/161
(Continued)

FOREIGN PATENT DOCUMENTS

EP          2238689          8/2009
WO       2009/095349 A1   8/2009

OTHER PUBLICATIONS

PCT International Search Report (Forms PCT/ISA/220 and PCT/ISA/210) for corresponding/related International Application No. PCT/IB2020/051758 dated May 27, 2020.
(Continued)

*Primary Examiner* — Peguy Jean Pierre
(74) *Attorney, Agent, or Firm* — Patent Portfolio Builders PLLC

(57) ABSTRACT

An analog-to-digital circuit that digitizes an analog voltage. The analog-to-digital circuit includes plural comparators functionally connected to form a tree that has levels i, and each level i has branches j, and an encoder connected to the plural comparators and configured to generate a digitized value of an input analog voltage. Each comparator from a level i has first and second outputs, and each of the first and second outputs is electrically connected to an input of different comparators from a next level i+1 of the tree.

17 Claims, 20 Drawing Sheets

(58) Field of Classification Search
USPC .................................. 341/155, 160, 161, 159
See application file for complete search history.

(56) References Cited

U.S. PATENT DOCUMENTS

2015/0244547 A1*  8/2015  Sinsky ................... H04B 10/60
                                                         398/202
2018/0069566 A1   3/2018  Soundararajan

OTHER PUBLICATIONS

PCT Written Opinion of the International Searching Authority (Form PCT/ISA/237) for corresponding/related International Application No. PCT/IB2020/051758 dated May 27, 2020.

* cited by examiner

SUCCESSIVE APPROXIMATION TREE CONFIGURATION FOR ANALOG-TO-DIGITAL CONVERTER

CROSS-REFERENCE TO RELATED APPLICATIONS

This application is a U.S. National Stage Application of International Application No. PCT/IB2020/051758, filed on Mar. 2, 2020, which claims priority to U.S. Provisional Patent Application No. 62/829,147, filed on Apr. 4, 2019, entitled "SUCCESSIVE APPROXIMATION TREE (SAT) ADC," and U.S. Provisional Patent Application No. 62/932,083, filed on Nov. 7, 2019, entitled "SUCCESSIVE APPROXIMATION TREE CONFIGURATION FOR ANALOG-TO-DIGITAL CONVERTER," the disclosures of which are incorporated herein by reference in their entirety.

BACKGROUND

Technical Field

Embodiments of the subject matter disclosed herein generally relate to a successive approximation tree (SAT) method implemented for an analog-to-digital converter (ADC), and more specifically, to a new topology of comparators in which a threshold reference is set in a dynamic way for an ADC converter.

Discussion of the Background

From the rapid growth of Internet of Things (IoT) applications arises the need for fast and ultra-low power microelectronics units. ADCs are indispensable units in most of these applications and it is necessary to enhance their performance and reduce their energy consumption, especially for portable and wearable devices. Successive approximation ADCs are one class of converters that have found their way into a myriad of applications given their medium-resolution and low-power consumption in comparison to other types of ADCs. Although time interleaving techniques and newer CMOS process technologies can enhance their performance, successive approximation register's (SAR) features are still traded off by more silicon area and lower conversion speed. For applications where data should be sampled more frequently to avoid aliasing, flash ADCs would be more suitable. However, the flash ADCs tend to use a large amount of power and suffer from higher kickback noise, which is not compatible with most wearable and implantable applications.

The resistive voltage reference ladder is the major power dissipating component of the flash ADC, because it requires a significant static current. Moreover, using dynamic comparators to conserve the energy introduces a kickback noise on both the input and the reference input voltages that might compromise the accuracy of the output of the comparator. Various dynamic comparator topologies have been introduced to reduce energy consumption while maintaining their fast operation. However, implementing these comparator topologies did not show a remarkable improvement for the significant inherent kickback noise of the flash ADC comparator stack. In addition, the current drawn by the resistor ladder is still considerably high.

Recent solutions eliminate the need for the resistor reference ladder [1]. Because dynamic comparators operate based on charge steering, the discharge rate can be controlled by resizing the physical dimensions of the reference transistors rather than supplying various reference voltages. By this internal customization of the effective discharge threshold, a single voltage can be used to bias the comparator stack instead of using a reference ladder.

However, the existing methods are still not optimal in terms of power consumption, simplicity of the encoding circuitry, and input and clock kickback noise. Thus, there is a need for a new system and topology that can overcome these limitations.

SUMMARY

According to an embodiment, there is an analog-to-digital circuit that digitizes an analog voltage, and the analog-to-digital circuit includes plural comparators functionally connected to form a tree that has levels i, and each level i has branches j, and an encoder connected to the plural comparators and configured to generate a digitized value of an input analog voltage. Each comparator from a level i has first and second outputs, and each of the first and second outputs is electrically connected to an input of different comparators from a next level i+1 of the tree.

According to another embodiment, there is an analog-to-digital circuit that digitizes an analog voltage, and the analog-to-digital circuit includes plural comparators functionally connected to form a tree that has i levels, and each level i has j branches. Only one comparator of the tree receives a clock signal, and each other comparator from all other levels receive as input the analog voltage, a reference voltage, and a signal from an output of a corresponding comparator from a previous level.

According to still another embodiment, there is a method for digitizing an analog input voltage. The method includes receiving at an analog-to-digital circuit the input voltage, wherein the analog-to-digital circuit has plural comparators functionally connected as a tree that has n levels and each level i has $2^{i-1}$ branches, comparing, at a comparator of a given level i and a given branch j of the tree, the input voltage with a supply voltage multiplied by a fraction F, where the comparing step is initiated by a signal from another comparator from a previous level i−1, and taking an output of the step of comparing as an i bit of the digital value of the analog input voltage.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

The following description of the embodiments refers to the accompanying drawings. The same reference numbers in different drawings identify the same or similar elements. The following detailed description does not limit the invention. Instead, the scope of the invention is defined by the appended claims. For simplicity, the following embodiments are discussed with regard to digitizing an analog voltage. However, the embodiments are not limited only to an analog voltage, but they may be applied to any analog signal.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

According to an embodiment, an ADC is implemented with a novel topology that mimics the convergence hierarchy of the successive approximation algorithm. Dynamic StrongARM latch comparators can be used with modified differential transistors sizes to operate as standalone comparators with fixed external voltage bias. This enable building a tree-like configuration to implement a successive approximation for analog-to-digital conversion. This Successive Approximation Tree (SAT) show a further reduction in energy consumption, simple encoding circuitry, very low input and clock kickback noise, low clock signal loading, enhanced successive approximation conversion time and high compatibility with dynamic encoders. Furthermore, the resolution of the novel SAT ADC topology can be reconfigured owing to the ease of controlling the tree levels.

Figure 1:
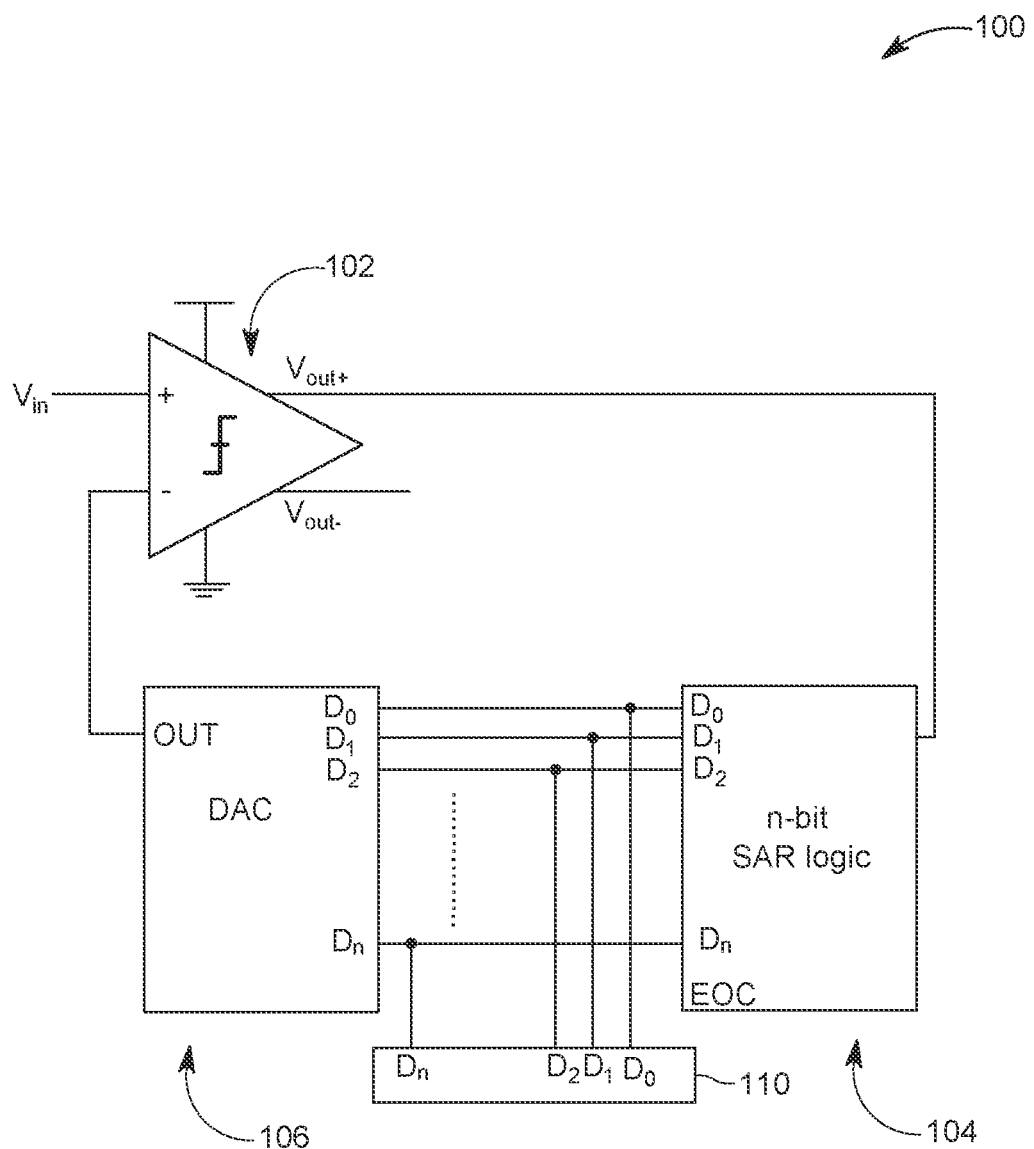
FIG. 1 is a schematic illustration of a successive approximation register (SAR) ADC circuit.
Figure 2:
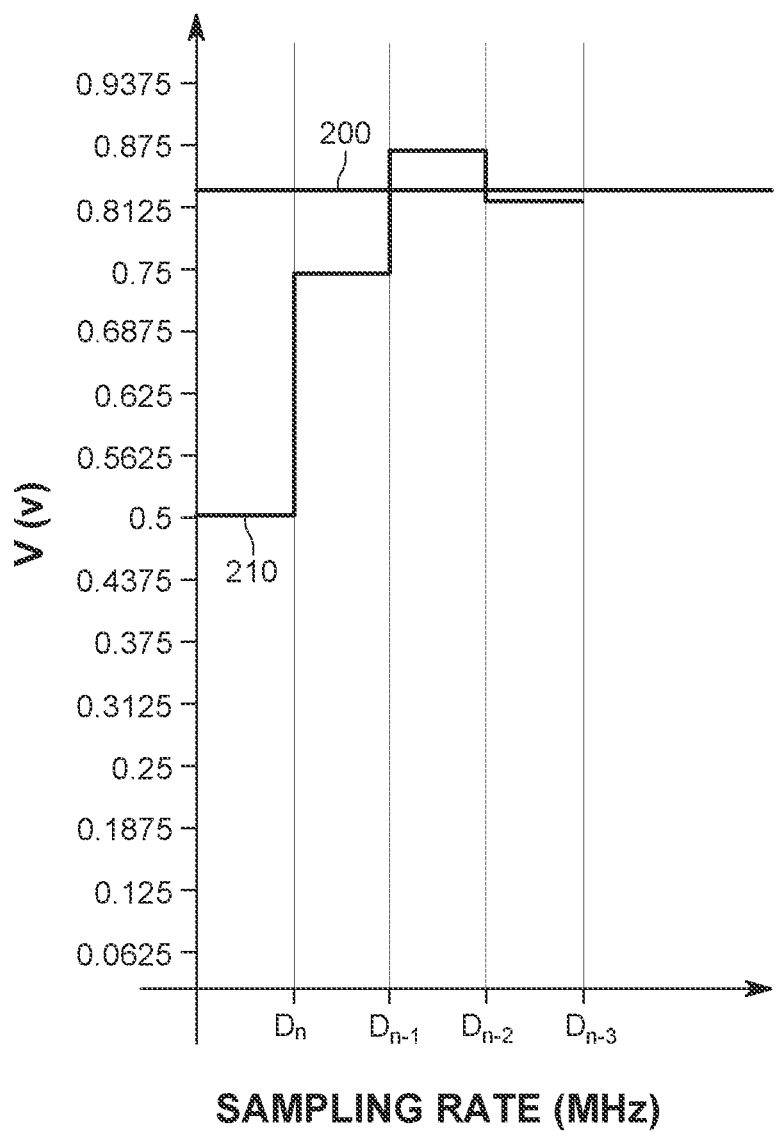
FIG. 2 illustrates the voltage comparisons made by the SAR ADC circuit.

To better understand the novel SAT ADC topology, it is believed that a summary review of the SAR ADC and flash ADC topologies is in order. FIG. 1 shows a SAR ADC circuit 100 that includes an analog voltage comparator 102, a successive approximation register circuit 104, and an internal reference digital-to-analog (DAC) converter 106. The analog voltage comparator 102 compares the input voltage Vin to an internal voltage of the DAC converter 106. The result of the comparison is outputted to the SAR register 104. The DAC converter 106 supplies the comparator 102 with an analog voltage equal to the digital code output of the SAR register 104. The digital representation of the analog input value Vin is obtained from the output 110 of the SAR register block 104. Depending on the number of bits n that are used to digitize the analog input voltage Vin, the SAR ADC circuit 100 compares the input voltage 200 (see FIG. 2) with the voltage 210 generated by the DAC converter 106, until the corresponding sequence of bits Dn to D0 is generated. This sequence of bits represents the digitized value of the analog voltage Vin.

Figure 3:
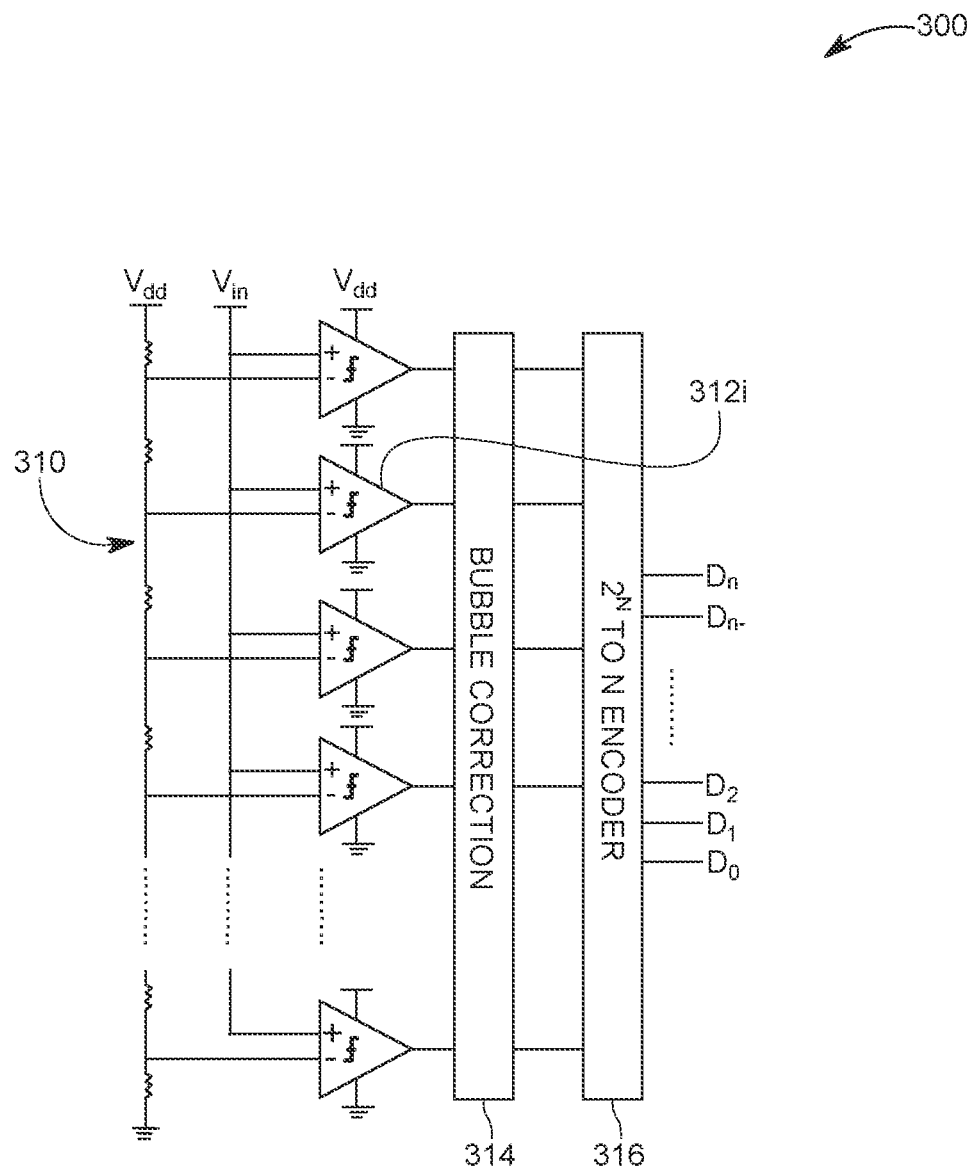
FIG. 3 illustrates a flash ADC topology and FIGS. 4A and 4B illustrate respective configurations of the comparators used by the flash ADC.
Figure 4A:
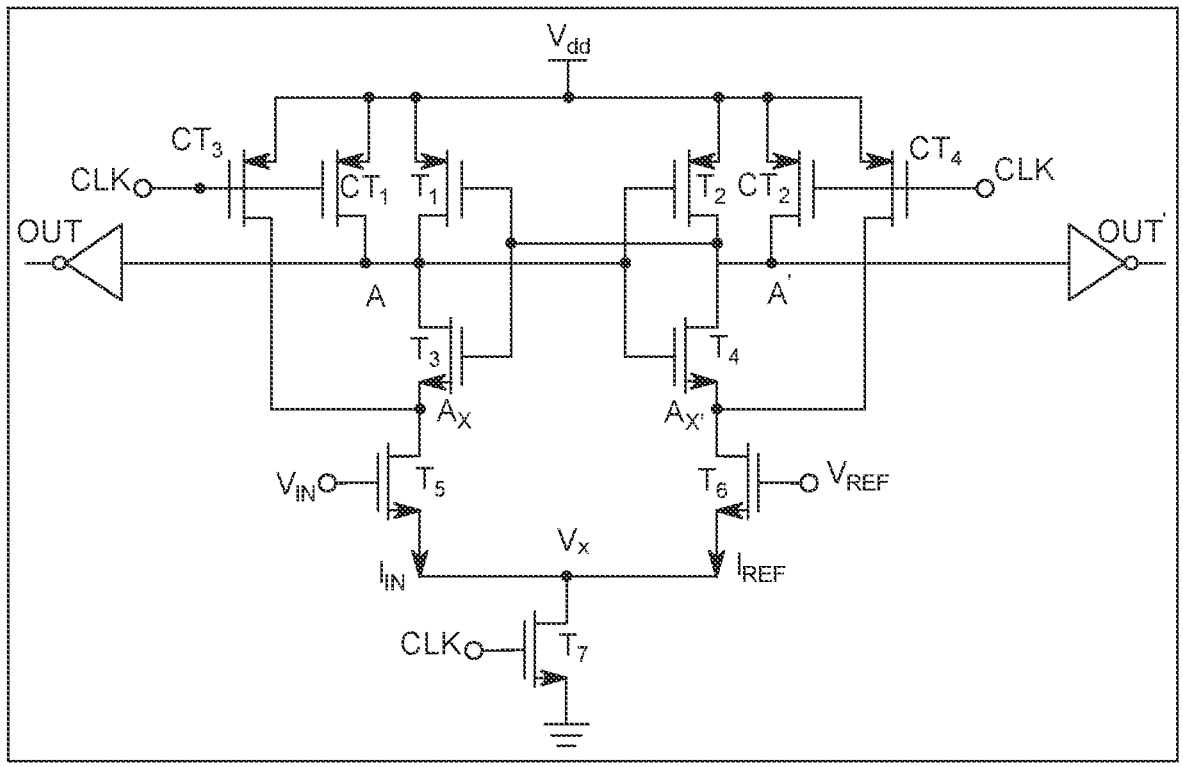
Figure 4B:
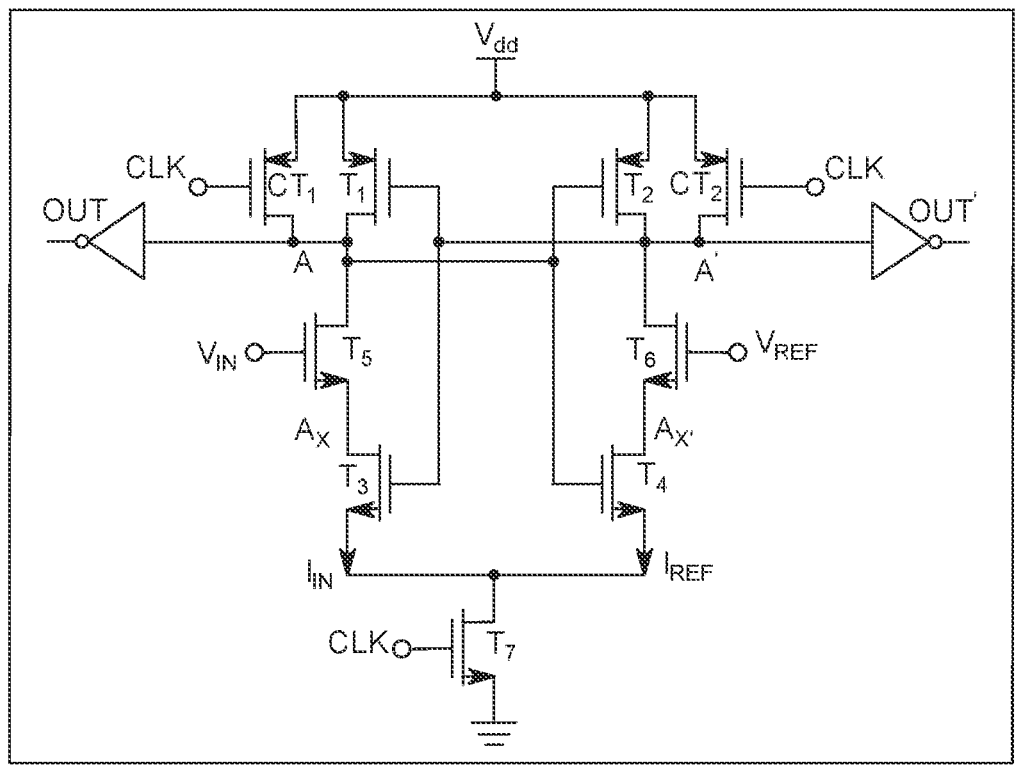
Figure 5:
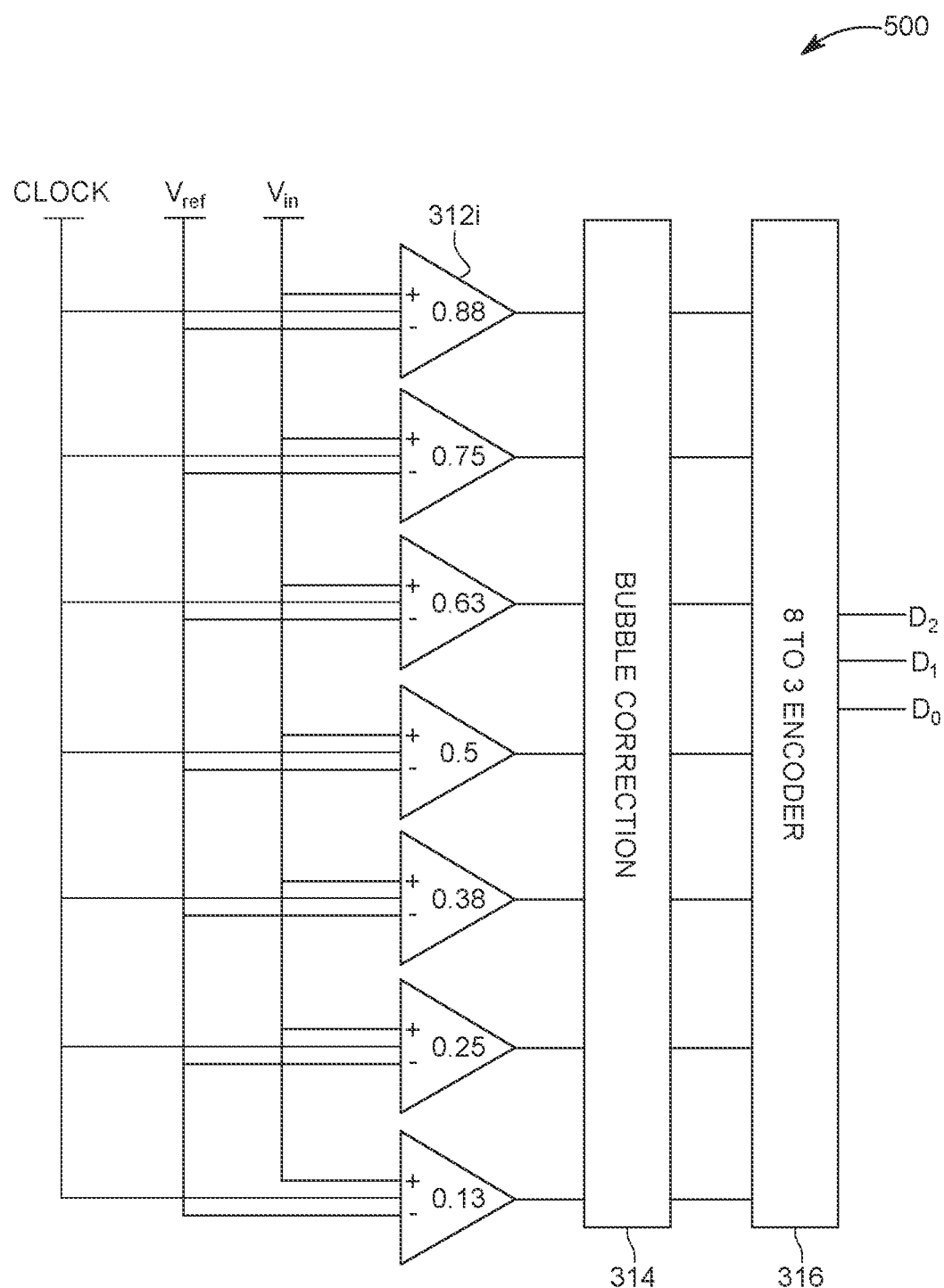
FIG. 5 illustrates a ladder-less ADC topology.

FIG. 3 shows a flash ADC circuit 300 which includes a resistor ladder 310, a plurality of comparators 312$i$, a bubble correction circuit 314, and an encoder 316. The reference voltage Vdd is split by the resistor ladder 310 into smaller voltages, and these voltages are compared for each "rung" of the ladder by a corresponding comparator 312$i$, with an input voltage Vin. If the input voltage Vin is larger than the voltage of the corresponding rung, a 1 bit is generated, otherwise a 0 bit is generated. These bits are then error corrected in the bubble error correction circuit 314 and encoded in the encoder 316 to generate the bits Dn to D0 that correspond to the digitized value of the input voltage Vin. A possible implementation (strongARM latch) of the comparator 312$i$ used in this topology is shown in FIG. 4A and a modified implementation of the comparator is shown in FIG. 4B. Both figures show plural transistors CT1, CT2, CT3, CT4, and T1 to T7. Because the ladder 310 of resistors is power hungry, a ladder-less Flash ADC topology 500 may be used, as illustrated in FIG. 5. Note that this topology uses the same bubble correction circuit 314 and encoder circuit 316 as the topology shown in FIG. 3. Different from that topology, the ladder-less Flash ADC topology 500 has a clock signal Clock that is input at each comparator 312$i$ to trigger them. The clock signal Clock triggers the comparators 312$i$ to start comparing the input voltage Vin with the reference voltage Vref. Note that this configuration requires that a clock signal is sent to each of the plural comparators 312$i$.

However, all these topologies have problems as previously discussed, and these problems are mainly associated with a large power usage and large kickback noise. Thus, a novel topology, SAT ADC, is introduced. It is implemented into a circuit 600 shown in FIG. 6 and includes plural comparators 610$_{ij}$ functionally connected to each other to form the branches j of a tree 610, and an encoding section 640. The index "i" describes the level in the tree and has a value from 1 to n, where n is the total number of digital output bits. The index "j" refers to each comparator's branch, for each level i of the tree. The index "j" is between 1 and $2^{i-1}$ for a given level i of the tree 610. The tree 610 has a single branch j=1 for the first level i=1, two branches j=1 and 2, for the second level i=2, four branches j=1, 2, 3, and 4 for the third level i=3, and so on. By setting a threshold reference 612$ij$ as a property of the dynamic comparators rather than obtaining it from an external reference ladder, this novel topology introduces flexibility in rearranging the comparators 610$_{ij}$. Due to this re-configurability feature, the SAT ADC circuit 600 can be built using standalone dynamic comparators.

Figure 6:
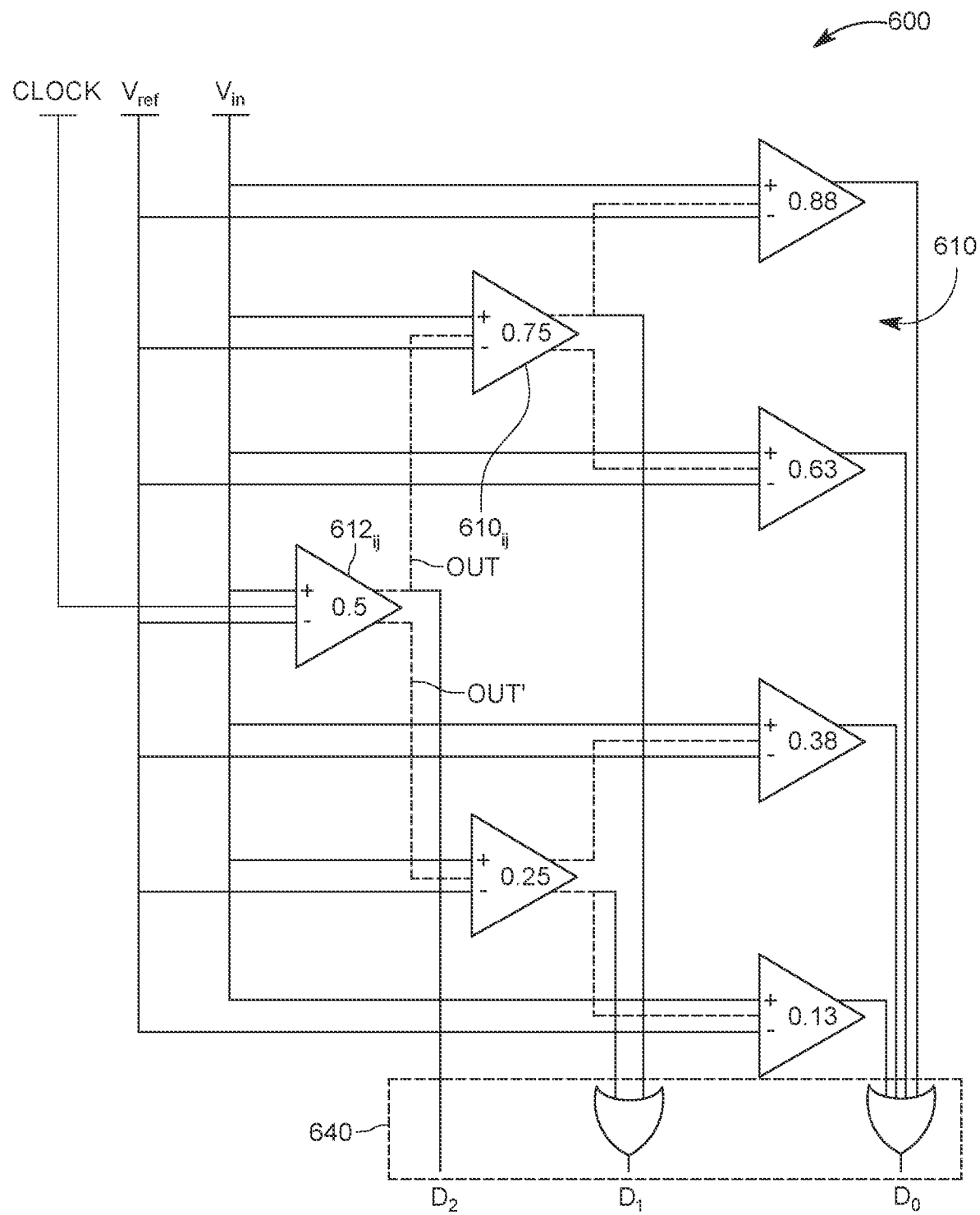
FIG. 6 illustrates a SAT ADC topology.

In the SAT ADC circuit 600, the clock signal is only set to trigger a single comparator, i.e., the comparator 610$_{11}$ having the $V_{dd}/2$ threshold voltage level. StrongARM latch comparators may be used in the SAT ADC circuit 600 because they can provide rail to rail outputs without performance or power degradation. FIG. 6 shows that each comparator 610$_{ij}$, except the first one, receives three inputs: an input voltage Vin, a reference voltage Vref, and a single output, OUT or OUT' which has a value of zero or one, from a previous comparator. In this regard, each comparator 610$_{ij}$ has two outputs OUT and OUT', each being supplied to a different next level comparator, as shown in the figure. The OUT output is also supplied to the encoding circuit 640. The outputs OUT and OUT' have complementary values, meaning that when one of them is one, the other one is zero and vice versa. In other words, the comparison between the input voltage Vin and a threshold voltage $612ij$, which is associated with the reference voltage Vref, results in the outputs OUT and OUT', which can be either (i) zero and one, respectively, or (ii) one and zero, respectively. A single reference voltage Vref is used for this embodiment and all the comparators have an identical structure.

The first comparison operation in the tree outputs the most significant bit (MSB) of the digital code, $B_n$, to be taken from the OUT terminal of the first dynamic comparator $610_{11}$. The outputs OUT and OUT' of a comparator with $V_{th}(ij)$ threshold voltage are, therefore, used to trigger the comparators with threshold voltages, $$V_{th}(i+1)(2j) = V_{th}(ij) + \frac{1}{2^{i+1}} \text{ and } V_{th}(i+1)(2j-1) = V_{th}(ij) - \frac{1}{2^{i+1}},$$

respectively, where $i \in [1,n]$ is an integer number with 1 and n representing the MSB and LSB tree levels respectively, and $j \in [2^{n-1}]$ representing the branches.

Figure 7A:
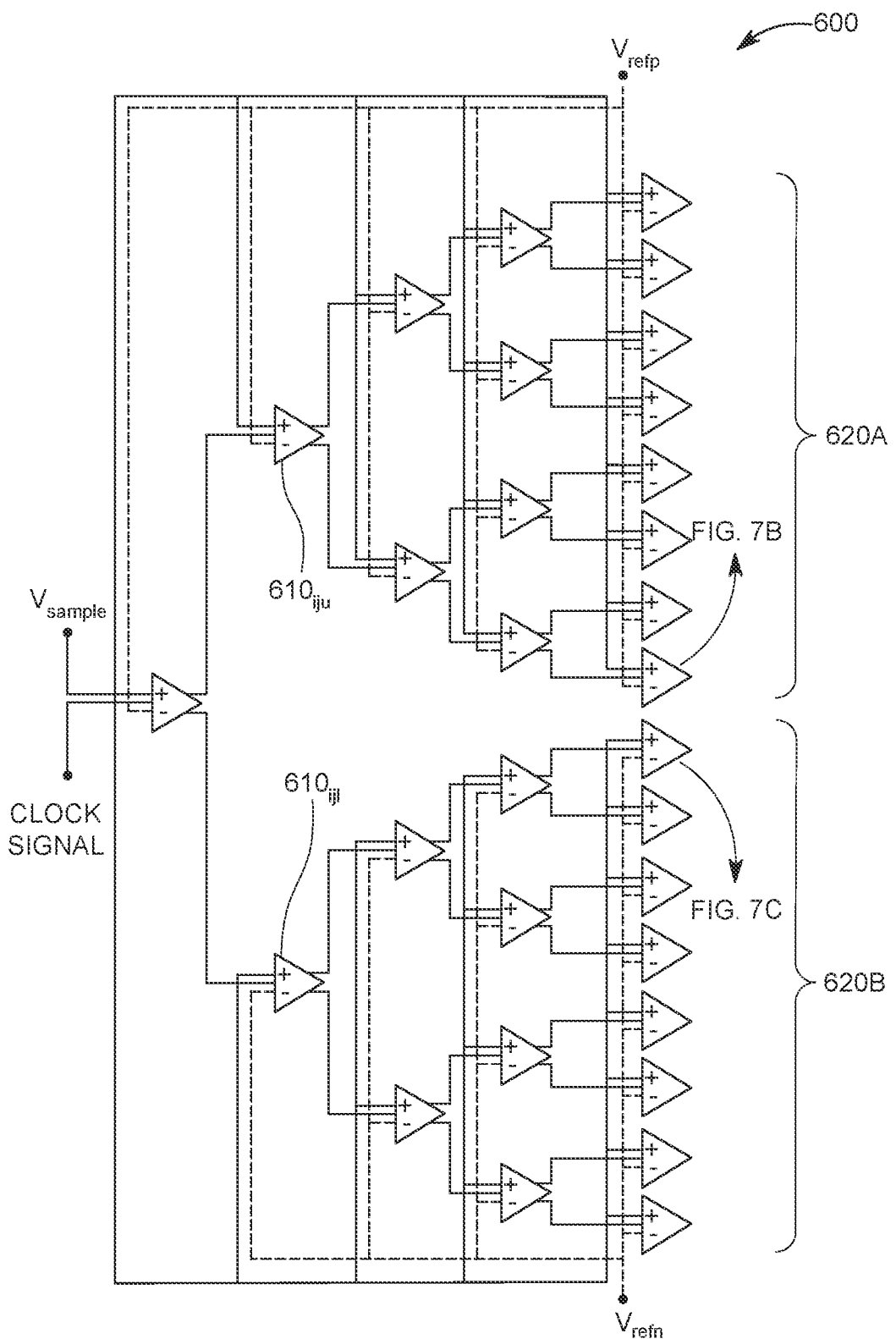
FIGS. 7A to 7C illustrate a variation of the SAT ADC topology and the configuration of two comparators that are used in the topology.
Figure 7B:
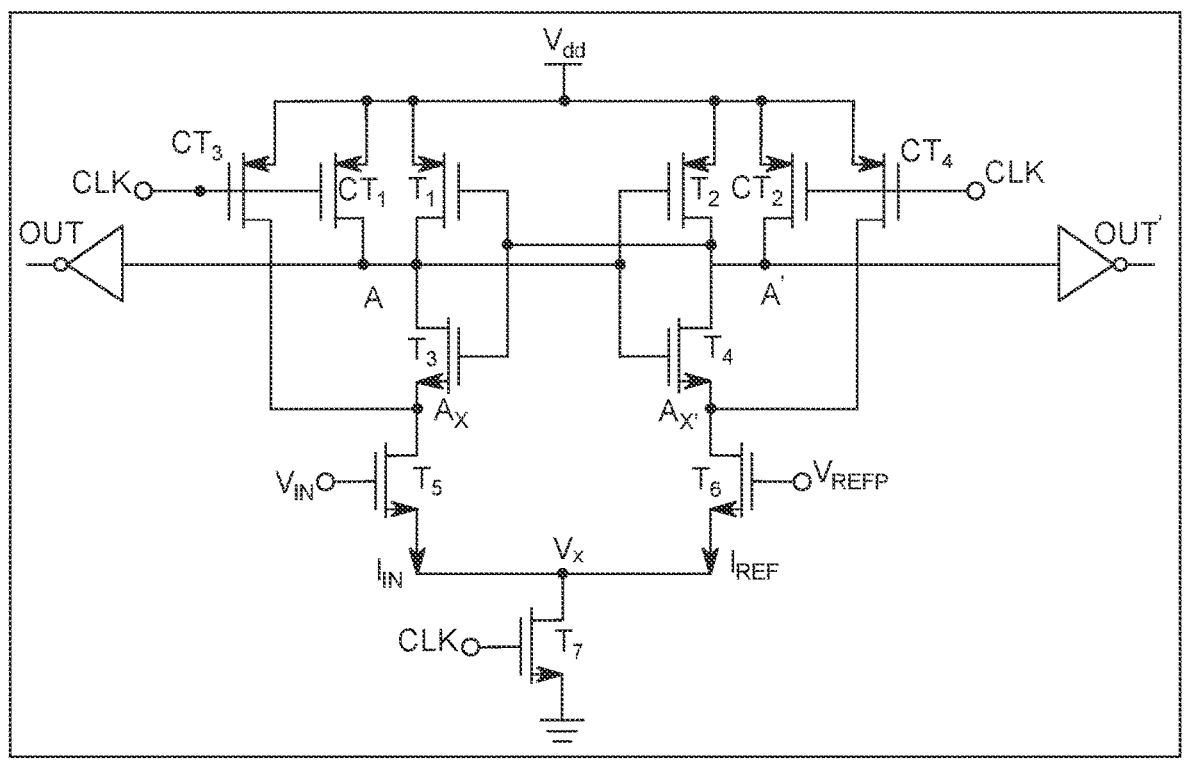
Figure 7C:
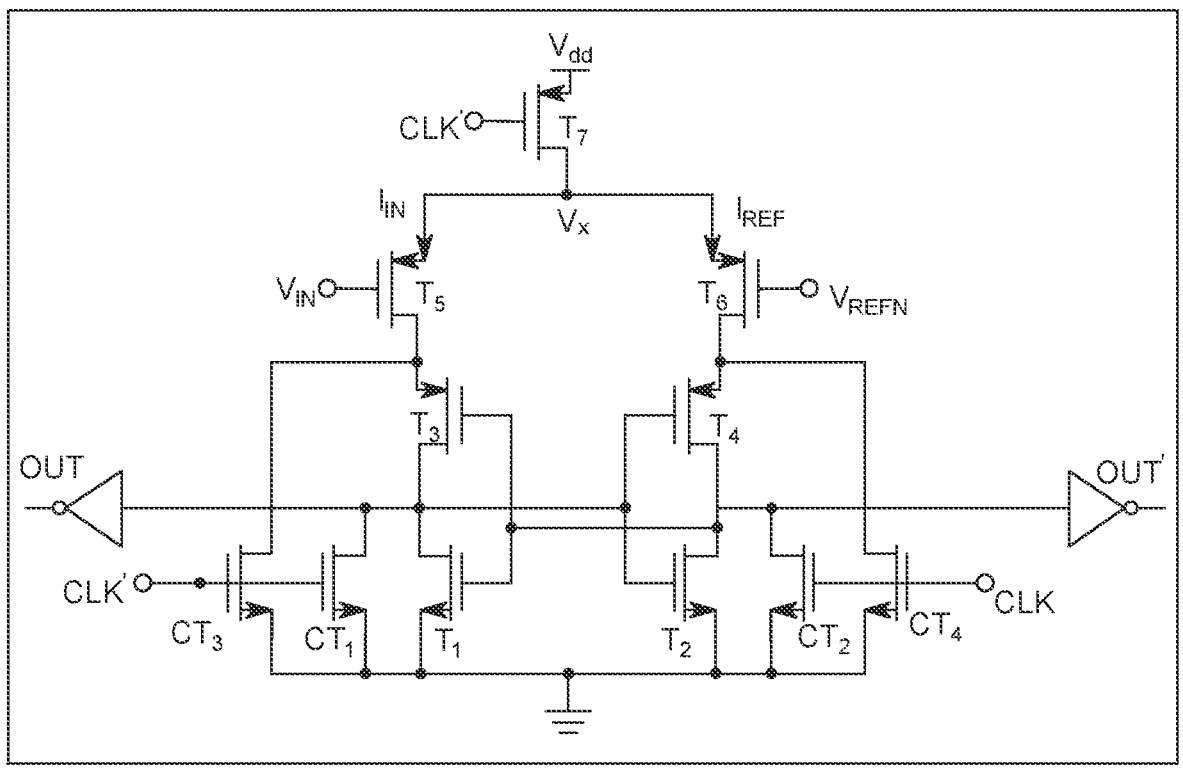

In another embodiment, illustrated in FIG. 7A, the upper half 620A of the SAT tree is comprised of the conventional StrongARM comparator $610_{iju}$ while the lower half 620B may include, for example, a "Helpee" StrongARM comparator $610_{ijl}$, as discussed in [1]. FIG. 7B shows the configuration of the upper comparator $610_{iju}$ for the upper half 620A and FIG. 7C shows the configuration of the lower comparator $610_{ijl}$ for the lower half 620B. Note that the two comparators may have the same amount of components (i.e., transistors), but the reference voltages applied to these components are different. In FIG. 7B, CT1 to CT4 transistors are PMOS while the T7 transistor is NMOS, which triggers the comparator by the active high clock signal. However, the complementary comparator shown in FIG. 7C, is triggered by the active low portion of the clock signal since its CT1 to CT4 transistors are NMOS and T7 is PMOS. In one embodiment, the configuration of the lower comparator $610_{ijl}$ is complementary (e.g., reversed) to the configuration of the upper comparator $610_{iju}$. In this embodiment, the upper comparators of the upper half 620A receive a first reference voltage Vrefp while the lower comparators of the lower half 620B receive a second reference voltage Vrefn, which is different from the first reference voltage Vrefp.

The complementary version of the conventional StrongARM configuration shown in FIG. 7C was chosen to ensure stability in the operation of the entire topology. The effective threshold values of the SAT comparators $610_{ij}$ were selected for constant reference voltages of $V_{refp}=0.7V$ and $V_{refn}=0.3V$. In this regard, note that the topology illustrated in FIG. 7A shows the use of two different reference voltages $V_{refn}$ and $V_{refp}$, while the topology shown in FIG. 6 uses a single reference voltage Vref if the Helpee comparator configuration was used for the lower part of the ADC.

Figure 8:
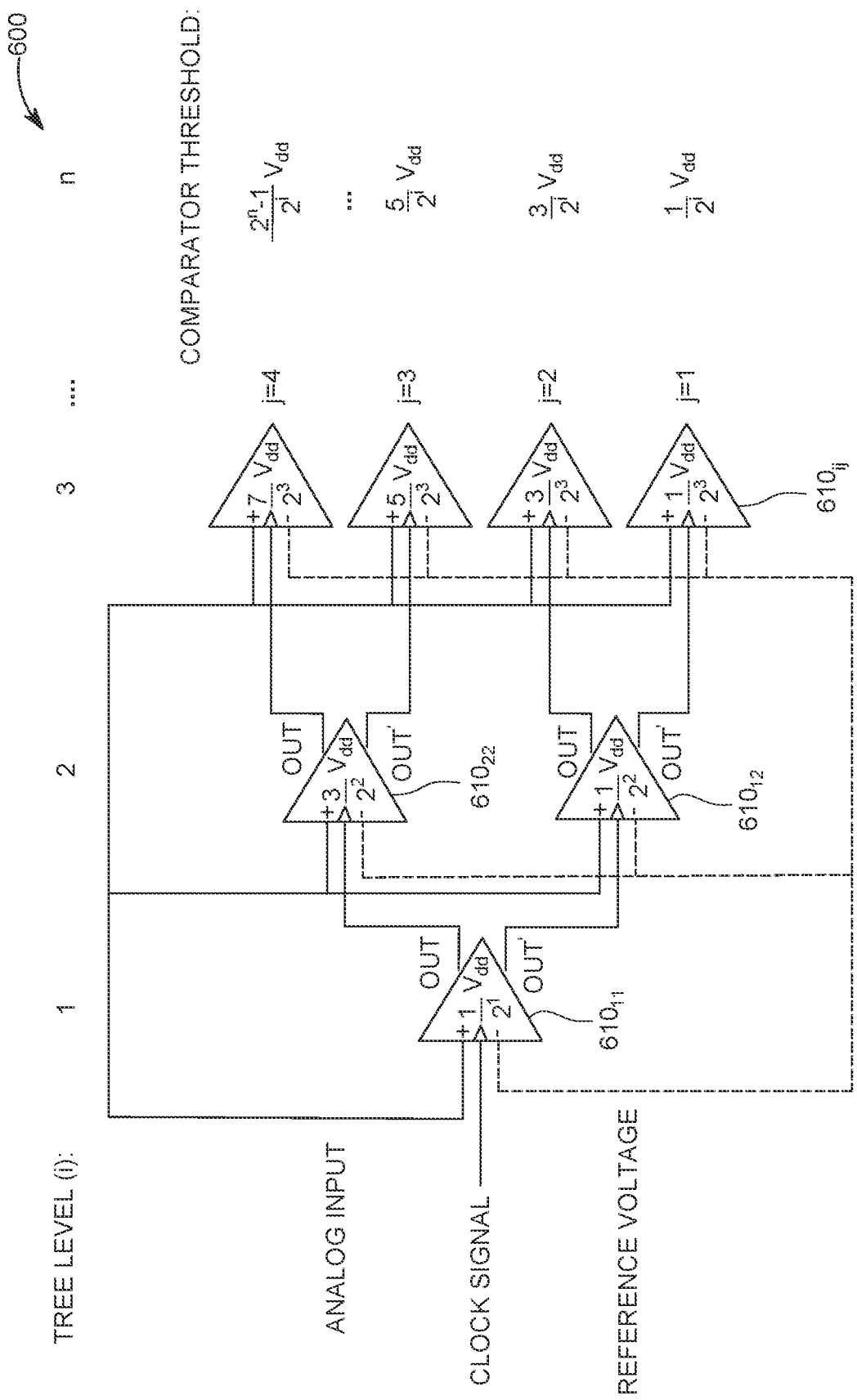
FIG. 8 illustrates in more detail the configuration of the SAT ADC topology.

FIG. 8 shows in more detail the SAT ADC circuit 600, the various comparators arranged at various tree levels i, and the corresponding comparator threshold voltages for each comparator. Note that the highest threshold voltage for each level i of the tree is selected to be a fraction $$F_{max} = \frac{2^i - 1}{2^i},$$

which is multiplied by the supply voltage $V_{dd}$, i.e., $F_{max} \times V_{dd}$, where the fraction $F_{max}$ is smaller than one, and the lowest threshold voltage for a given level i is selected to be a fraction $$F_{min} = \frac{1}{2^i},$$

which is multiplied by the $V_{dd}$, i.e., $F_{min} \times V_{dd}$, where the fraction $F_{min}$ is also smaller than one, as illustrated in FIG. 8. For any threshold voltage for a given level i and a given branch j, the fraction F is given by $$\frac{2j-1}{2^i}$$

and this fraction is multiplied by the supply voltage to obtain the threshold voltage. Thus, the threshold voltage changes from level to level and from branch to branch.

Figure 9A:
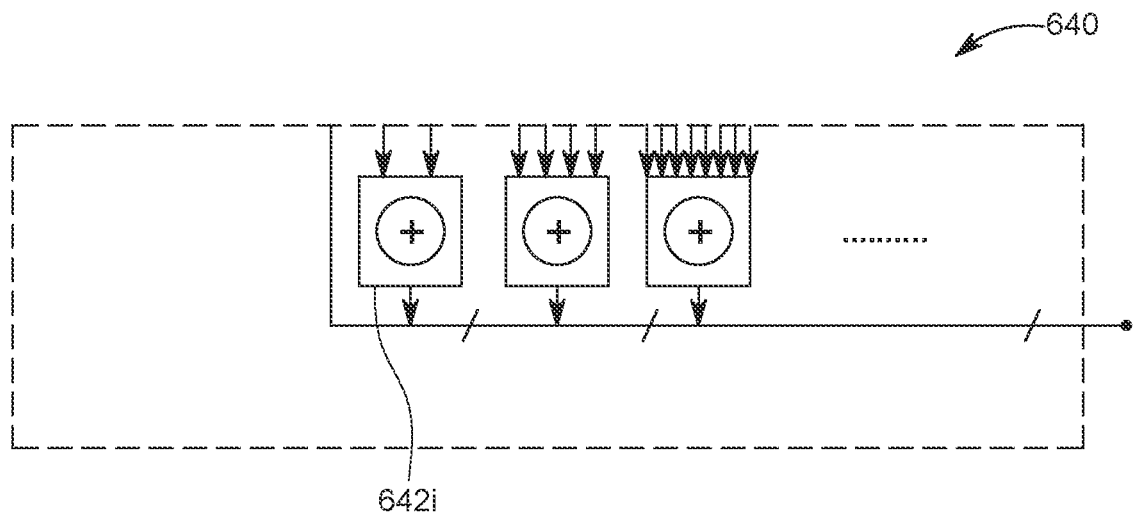
FIGS. 9A and 9B illustrate the configuration of an encoder used with the SAT ADC topology.
Figure 9B:
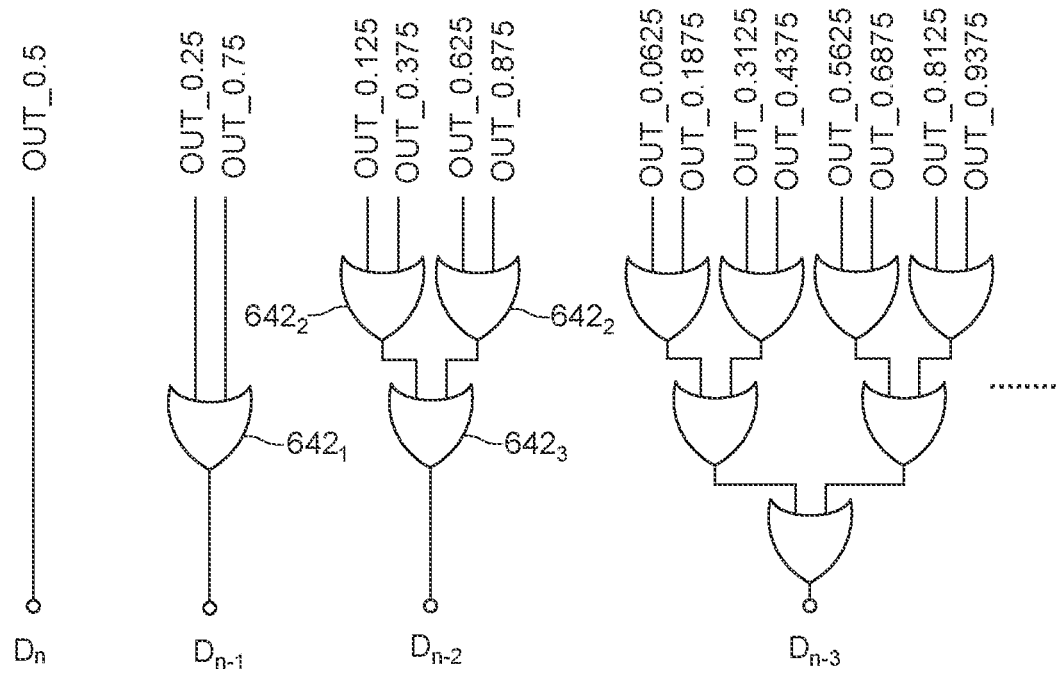
Figure 10:
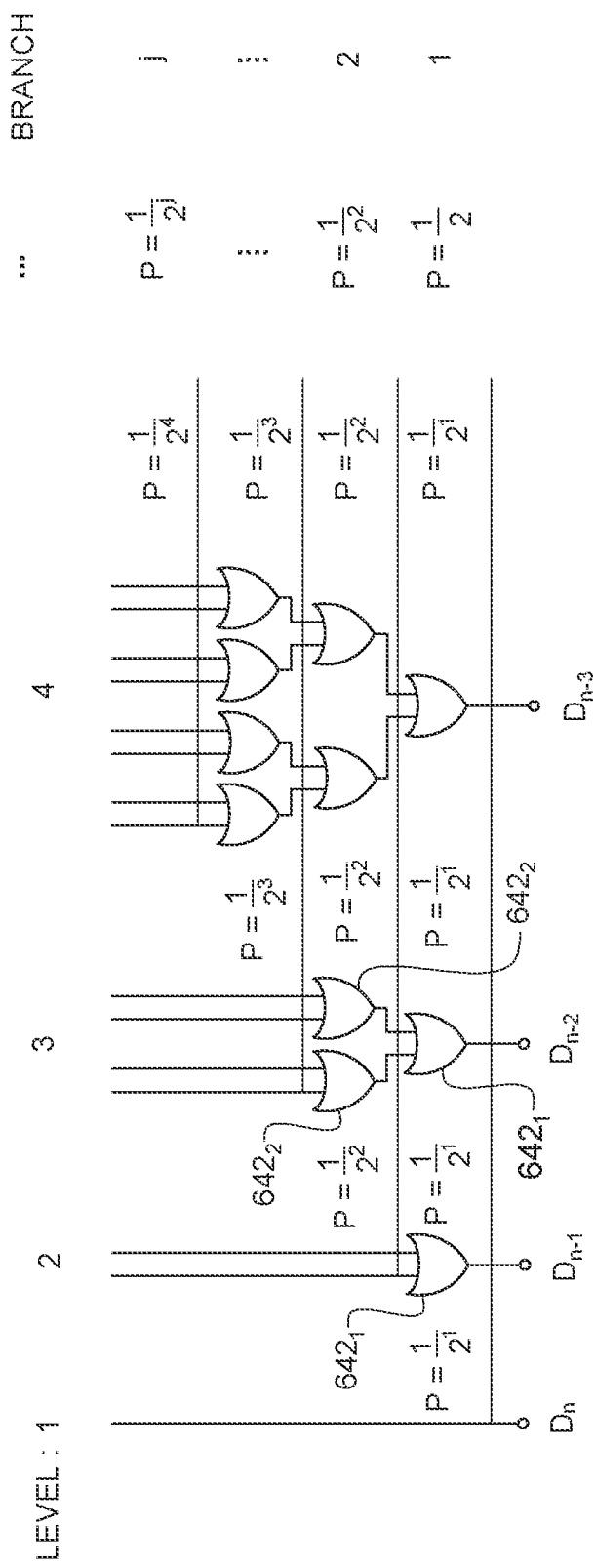
FIG. 10 illustrates how the bits of the digitized value of an analog voltage are generated.

The encoder circuit 640 of the SAT ADC circuit 600 is illustrated in more detail in FIGS. 9A and 9B. FIG. 9A shows the logic $642i$ that is used to combine the outputs from the various comparators for generating a given bit for each level of the tree. For example, with i describing each level, the logic $642i$ includes plural OR gates. FIG. 9B shows that for the first bit $D_n$, the output (zero or one) from the output OUT the first comparator $610_{ij}$ is taken as is. However, for the second level i=2, the second bit $D_{n-1}$ is generated by using an OR gate $642_1$ that uses as input the outputs from the OUT of the two comparators $610_{21}$ and $610_{22}$ for the second level, and so on. FIG. 10 shows in more detail the logic $642i$, and the high-logic probabilities P for the encoder nodes as they come from various levels i and various branches j of the tree.

Figure 11:
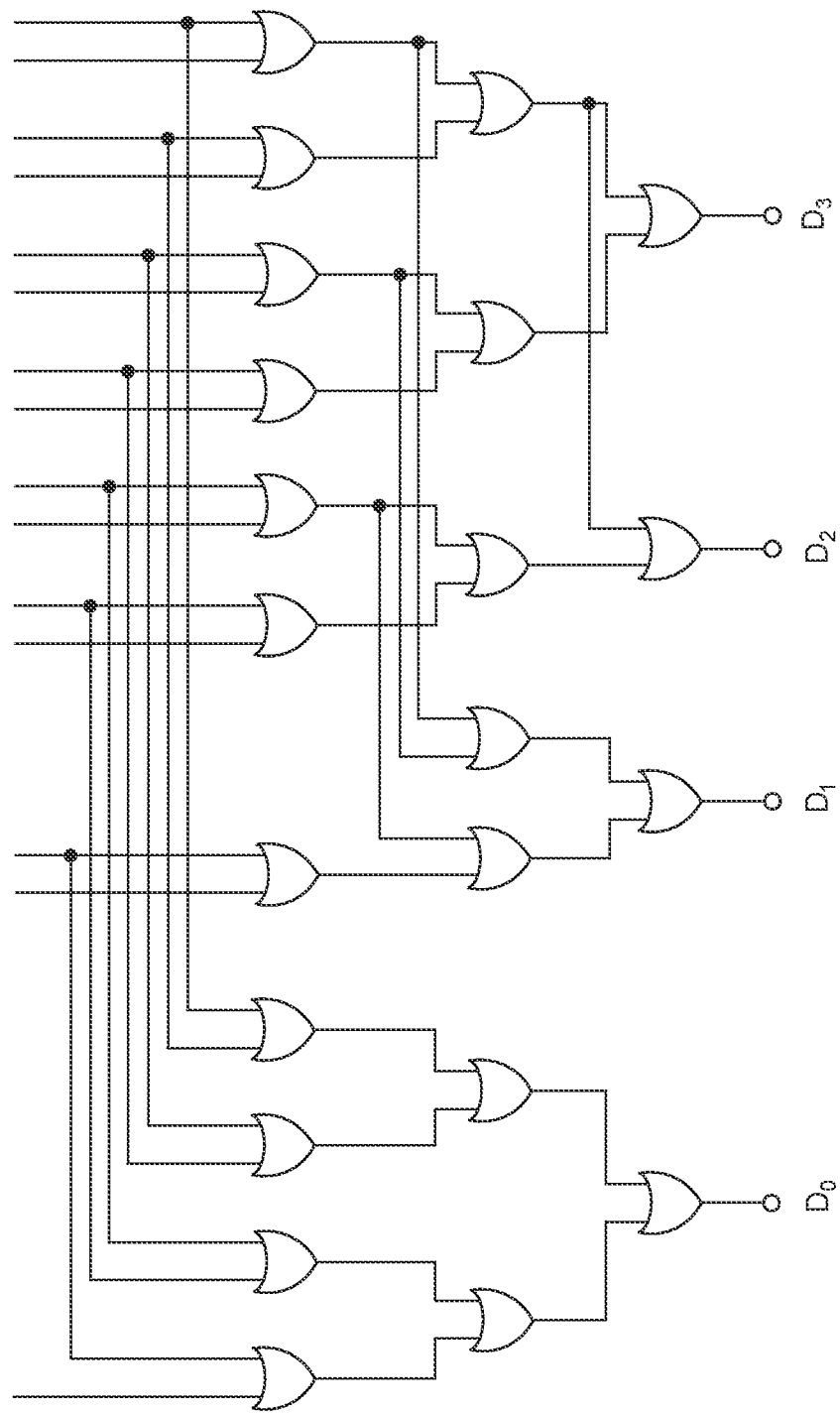
FIG. 11 illustrates a traditional encoder of an ADC circuit.

The number of gates $642i$ used for each level$_i$ is given by $2^{i-1}-1$, resulting in a total of $2^n-(n+1)$ OR2 gates for a resolution of n bits. Note that each level of the SAT ADC tree delivers a single bit, which is obtained by logically ORing the OUT terminals of the comparators from each tree level. The total number of gates $2^n-(n+1)$ in the encoder represents exactly the half number of OR2 gates used in a fat tree encoder, which is illustrated in FIG. 11. This figure illustrates the creation of a fat tree encoder by merging two SAT encoder trees. It is noted that the SAT ADC encoder of FIG. 10 is simpler than the traditional flash ADC fat tree encoder of FIG. 11.

One or more of the advantages for the SAT ADC topology are now discussed and compared to both SAR and Flash ADCs in terms of energy consumption, kickback noise, sampling rate, clock loading, resolution, and compatibility of dynamic encoder.

The new SAT ADC topology uses less energy than the traditional topologies as now discussed. The power consumption for Flash ADC can be calculated as follows:

$$\text{Power}_{Flash} \approx \text{Power}_{Comp} + P_{Comp\text{-}stack} + P_{BEC} + P_{TH2OH} + P_{FAT\text{-}enc} + P_{clk} \qquad (1)$$

where $P_{comp\text{-}int}$, $P_{comp\text{-}ext}$, $P_{BEC}$, $P_{TH2OH}$, $P_{FAT\text{-}enc}$, and $P_{clk}$ represent the total dynamic switching power of the internal nodes of latch comparator, comparator output inverters, Bubble Error Correction gates, Thermometer to One Hot code gates, Fat Tree encoder gates, and clock signal driving the stack of comparators.

The total amount of power dissipated by the SAT ADC topology can be approximated as:

$$Power_{SAT} \approx Power_{Comp} + Power_{Comp-tree} + Power_{SAT-enc} + Power_{clk} \quad (2)$$

where $Power_{Comp-tree}$ represents the switching power consumed by the output comparator terminals driving subsequent comparator clock nodes and SAT encoder inputs, while $Power_{SAT-enc}$ stands for the dynamic power dissipated by the SAT encoder OR gates.

In each of the i tree levels, the comparator output probability is given by $1/2^i$ due to the branching. Given that only the OUT terminals are linked to the encoder, the effective level capacitances used for calculating the dynamic power is $2^{i-1}(2C_{inv}+2C_{Comp-CLK}+C_{OR})$, in which $C_{inv}$, $C_{Comp-CLK}$, and $C_{OR}$ represent the portions of node capacitance due to the output inverter of the previous driving comparator, input clock gate capacitances of next stage comparators, and encoder OR gate input capacitance. The analysis of the SAT encoder power consumption is shown in Table 1.

TABLE 1

SAT Encoder Power Calculation

| | |
|---|---|
| Probability, $P_i(1)$ [Dependent Inputs] | $1/2^i$ |
| Activity factor, $\alpha_i = P_i(1)P_i(0)$ | $(2)^{-i} - (2)^{-2i}$ |
| Total No. of vertical levels | n |
| OR gates per horizontal level, $N_{OR/leveli}$ | $2^{i-1}$ |
| Total No. of vertical levels | $j - 1$ |
| Total Switching Power per Level$_{vj}$, $P_{vj} = \sum_{i=1}^{j-1} \alpha_i N_{OR/leveli}(C_{inv} + C_{OR})V^2 f$ | $\sum_{i=1}^{j-1} 6(2^{-i} - 2^{-2i})(2^{i-1})C_g V^2 f = \left[3j + 6\left(\frac{1}{2}\right)^j - 6\right]C_g V^2 f$ |
| Total SAT Encoder Switching Power = $\Sigma_{j=1}^{n} P_{vj} = \Sigma_{j=1}^{n}[3j + 6(1/2)^j - 6]C_g V^2 f$ | $3/2 \; [n^2 - 3n - 2^{2-n} + 4] \; C_g V^2 f$ |

Since the clock signal drives only the first comparator for the SAT ADC, the total effective capacitance used for power calculation is about 12 $C_g$. This yields a total switching power of:

$$Power_{Comp-tree} \approx C_g V^2 f \left[\left(\frac{3}{2}\right)n^2 + \left(\frac{149}{2}\right)n + 37(2^{-n}) - 25\right]. \quad (3)$$

Figure 12:
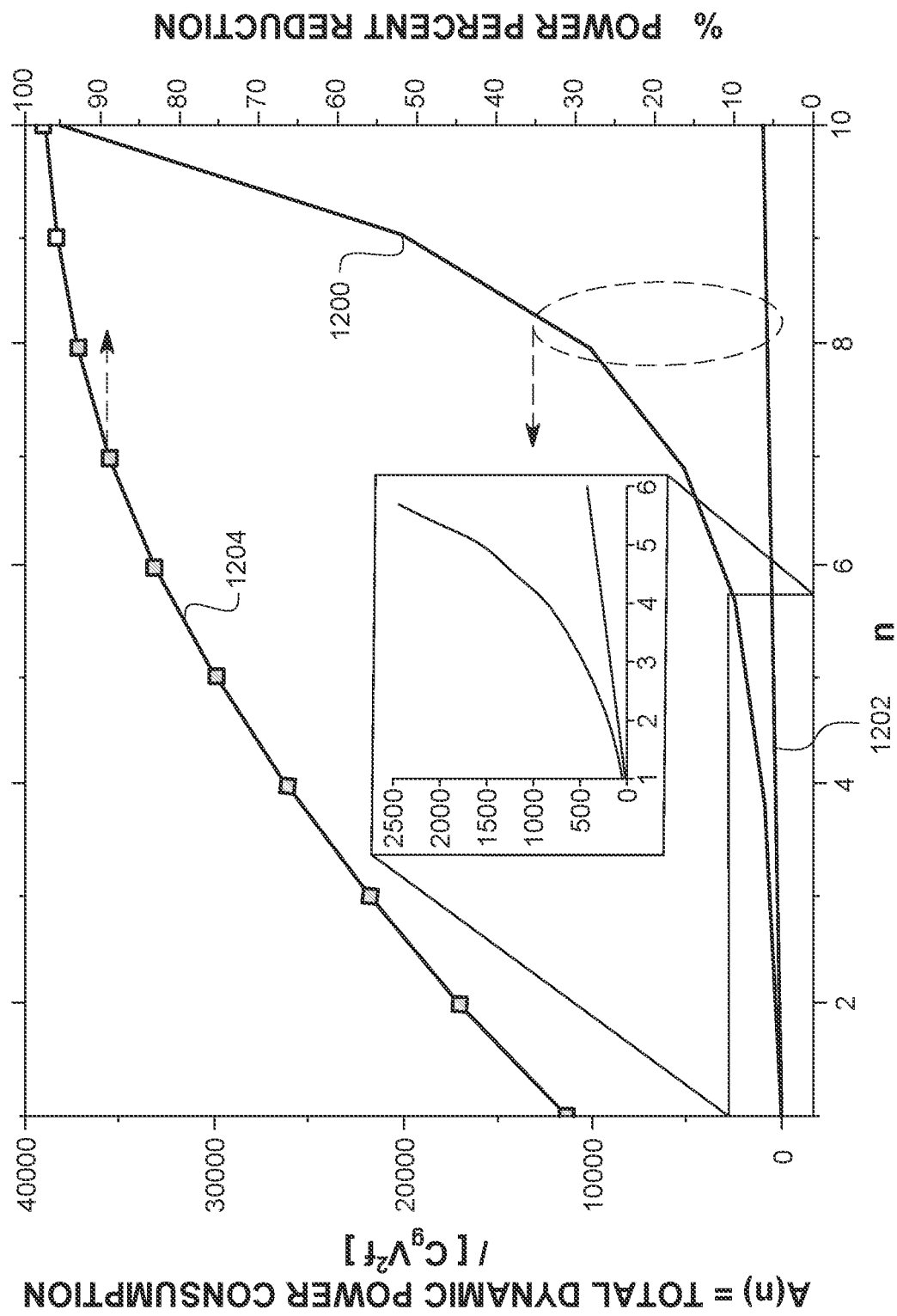
FIG. 12 illustrates the power consumption of a traditional ADC circuit and the novel SAT ADC topology.

FIG. 12 compares the power consumption of the Flash ADC topology of FIG. 5 and the SAT ADC topology of FIG. 6, in terms of A(n), which is defined as A(n)=Power/$(C_g V^2 f)$, where A(n) describes the normalized power relative to the supply voltage, frequency, and CMOS technology. It is noted that the power consumption curve 1200 of the Flash ADC is higher than the power consumption curve 1202 of the SAT ADC for small n (i.e., n smaller than 6), while the power consumption of the Flash ADC dramatically increases when n is larger than 6. Curve 1204 illustrates the power percent reduction of the novel SAT ADC topology.

Another feature for the existing topologies and the novel SAT ADC topology, which is of importance to those skilled in the art, is the performance of these circuits. It takes n clock cycles to get to the final digital output for a conventional SAR ADC. As the minimum sampling time of the SAR ADC is being governed by the delay of the latch and the setup time of the SAR D-Flip flops, the minimum sampling time of a SAR ADC circuit can be estimated as:

$$T_{sampling} = n(T_{comp} + T_{SAR} + T_{CLK_{low}}). \quad (4)$$

Time interleaving can be used to improve the limited bandwidth. Nevertheless, the time interleaving introduces other issues, such as mismatches between channels and timing-skew. Although these concerns are not present for flash ADCs, large power dissipation and noise are experienced by this topology, which are major drawbacks to be addressed. In addition, the PVT variations along with the inherent kickback noise of the dynamic comparators can compromise the values of the reference ladder and the final digital code as a result. To implement first and second order Bubble Error Correction (BEC), $(2^n-2)$ NAND3/NAND4 gates need to be used. This means that a total of $2(2n-(n+1))$ OR2 logic gates are used for a typical Fat Tree encoding circuit, which adds to the time delay.

The time delay for the SAT encoding tree can be calculated while taking the unity branching of all SAT encoder gates into consideration. The sampling time is best represented as:

$$T_{SAT-sampling} = nT_{comp} + T_{encoder-B0} + T_{CLK_{low}} \approx nT_{latch} + ln(2)(17)(n-1)RC_g + T_{CLK_{low}}. \quad (5)$$

For a 50% duty cycle sampling clock, the delay can be approximated as:

$$T_{SAT-sampling} = 2nT_{comp} + 2ln(2)(17)(n-1)RC_g. \quad (6)$$

Figure 13:
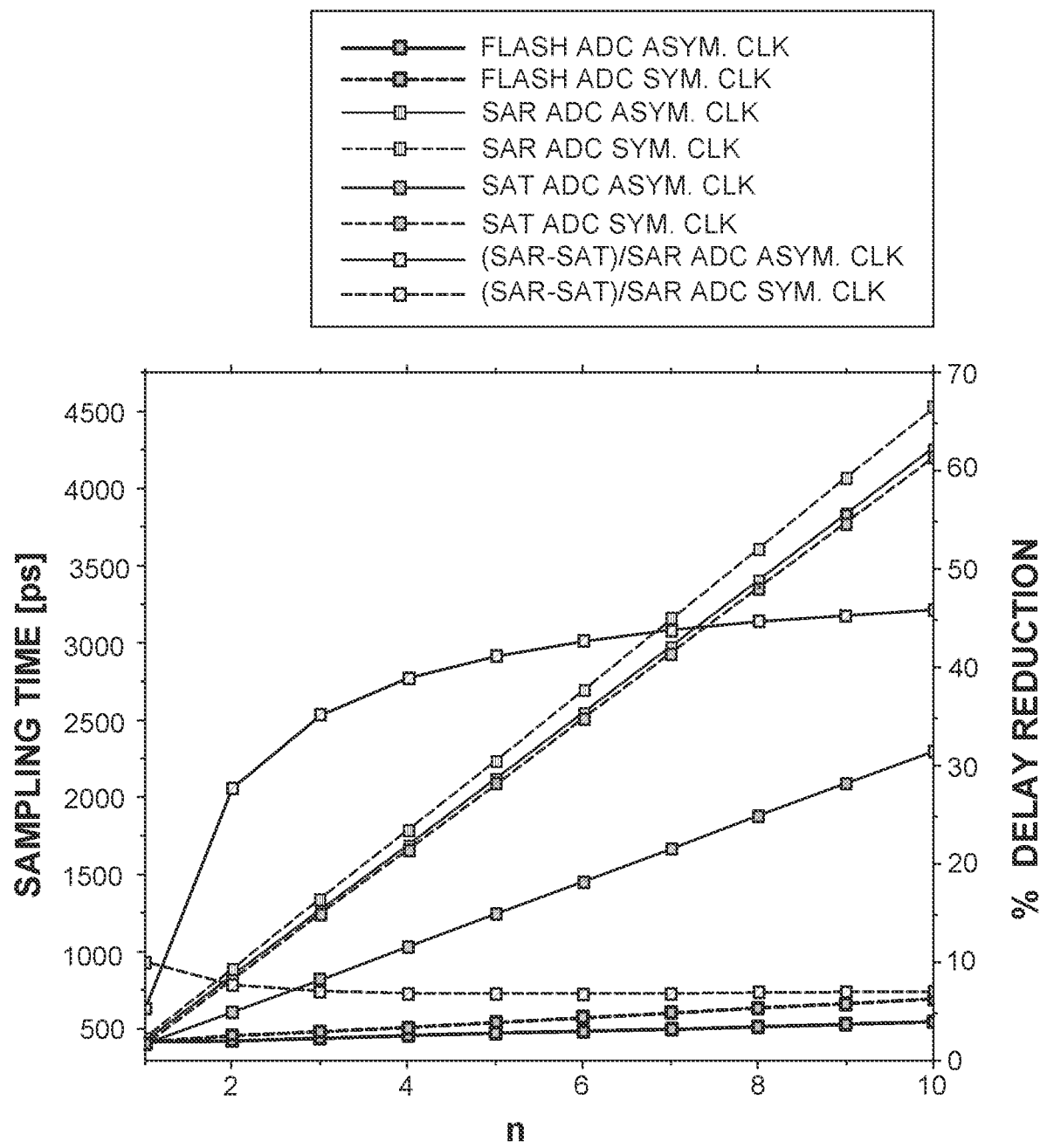
FIG. 13 illustrates the time response of the traditional ADCs and the novel SAT ADC topology.

Assuming the total comparator delay, $t_{comp}$, equals 182 ps as reported in the literature, and the $RC_g$ product for the 65 nm technology being about 1 ps, the performance for Flash, SAR and SAT ADCs are illustrated in FIG. 13 as a function of n. Although neither SAT ADC nor SAR ADC have performances that are comparable to that of the flash ADC, SAT ADC shows delay reductions of 10%–7.1% for symmetric clock signal with respect to SAR ADC. This reduction reaches 5.3%-50% for asymmetric clock signal with $T_{CLK\_low} = T_{comp}$.

For all ADCs, the propagation delay varies among the comparators and encoder gates due to the PVT variations. Unless properly sized and used with a symmetric clock path tree, flash ADC encoders would suffer from signal glitching; this increases the activity factor and power consumption. On the contrary, the SAT encoding circuit does not encounter such an issue and is being risk-free of monotonicity violations. Thus, dynamic gates can be used for the encoding unit to further reduce power consumption. It can also be inferred that the encoding unit of the SAT ADC circuit occupies less than half the area of flash ADC post-comparator encoding circuits.

With regard to the kickback noise, which is also referred to in the literature as flashback, it is more pronounced in flash ADCs due to the dynamic comparators. The feedthrough due to the node switching of the stacked comparators is significantly reduced in the SAT ADC circuit. Because only n comparators are triggered for an n-bit ADC, the percent of kickback noise reduction on the inputs is $$\frac{(2^n - 1) - n}{2^n - 1} \times 100\%.$$

Even though inputs of SAR ADCs experience kickback noise for n cycles, the rail to rail configuration of the comparators necessitates the use of input NMOS and PMOS transistors that result in an increase in the capacitance and feedthrough effect for each comparison cycle.

With regard to the reconfigurable resolution, despite the performance shortcoming in successive approximation technique in comparison to flash conversion, the bit by bit convergence can be utilized to predict the desired resolution. The consequent resolution re-configurability comes in favor of the majority of sensing applications in IoT and biomedical fields where high resolution is only required to capture meaningful details of the signal. The majority of measured signals have certain Probability Density Function (PDF) distributions and are sparse in nature; this fact was used by the circuit designers and researchers to tailor ADCs for their applications. Delta-Modulation, asynchronous level crossing, adaptive sampling and nonlinear quantization are some of the reported techniques used for signal specific ADCs. Even though Entropy-Coding analog-to-digital Converters (ECOCs) have been found to involve data compression and A/D conversion within a single process, they either deliver loosely-compressed data, or adopt extra thresholding and prediction units that add to the complexity of the overall conversion circuit.

Figure 14A:
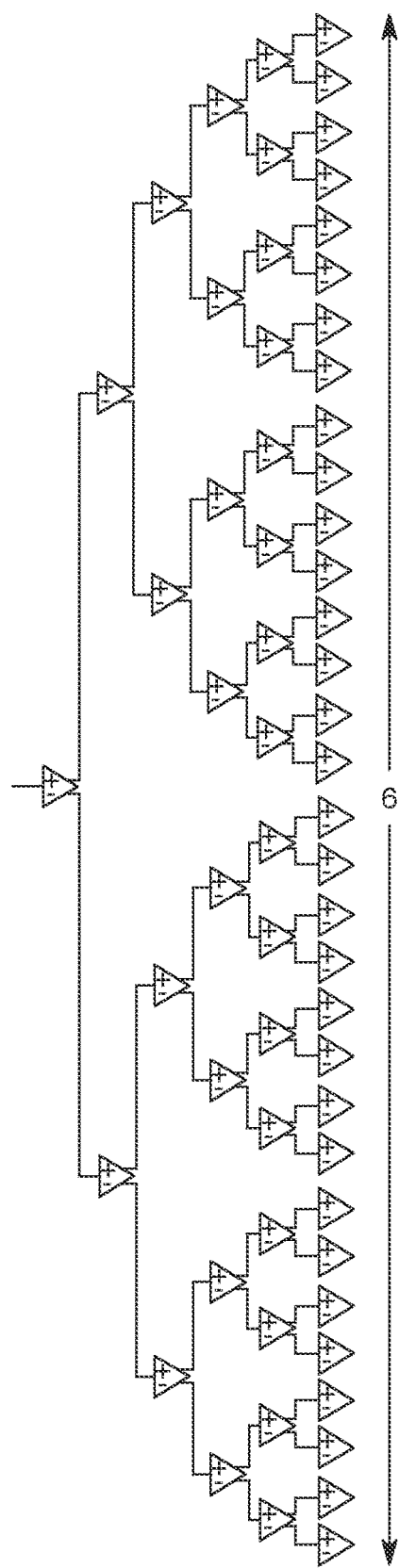
FIGS. 14A to 14C illustrate various implementations of the tree of the SAT ADC topology.
Figure 14B:
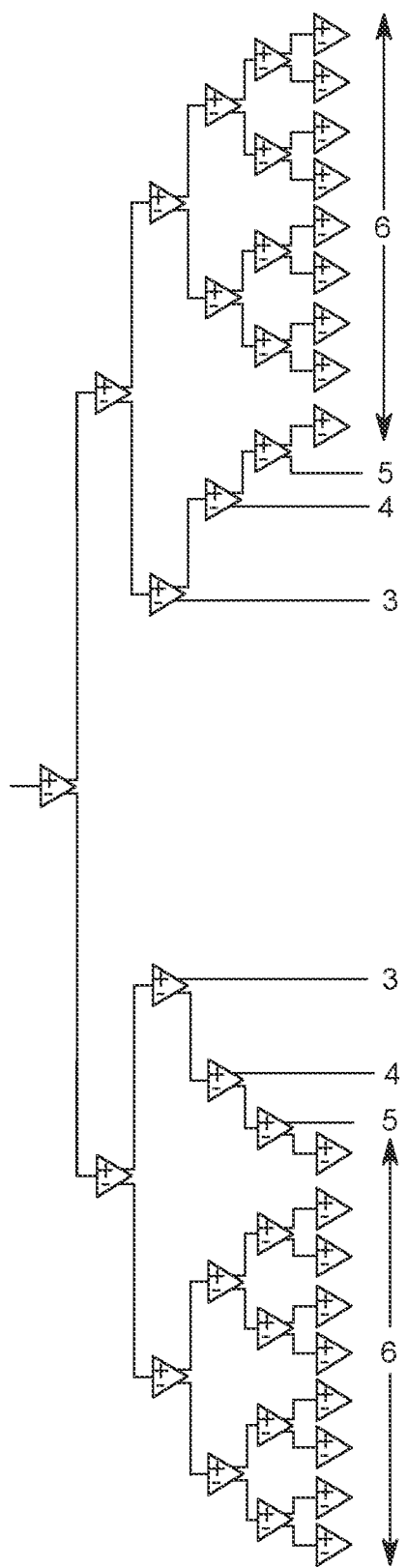
Figure 14C:
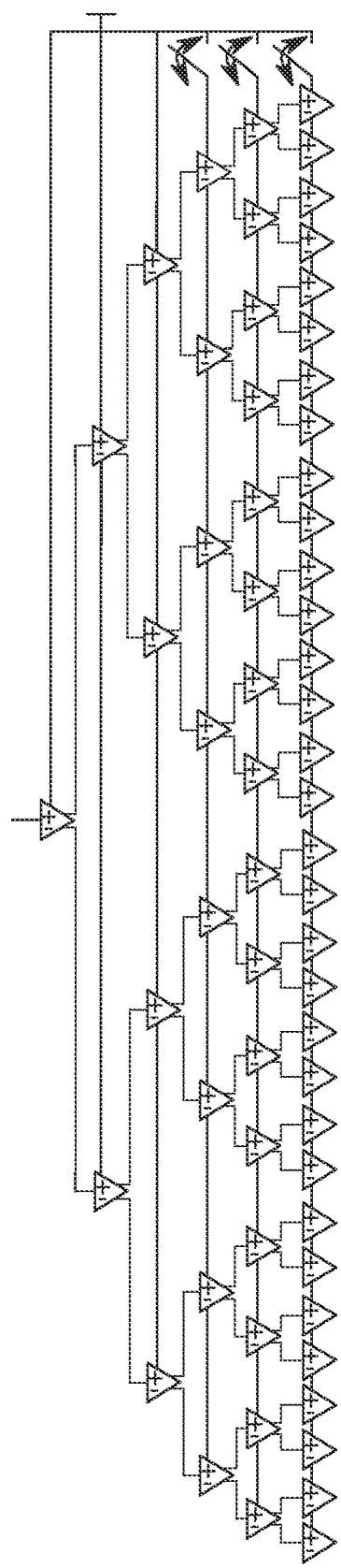

Extensive research about reconfigurable resolution has been carried out using SAR ADCs. However, complex resolution adaptation algorithms were used for classification and resolution assignment. SAT ADC configuration is more suitable to have its resolution reconfigured while restricting the power consumption to the operating comparators and encoders. In this regard, FIGS. 14A and 14B illustrate the 6-bit preliminary reconfiguration of SAT ADC for Shannon Fano coding and FIG. 14C shows the power gating for the SAT ADC tree levels. Hence, Variable-Length Codes (VLC) created by Shannon-Fano, Huffman and other entropy coding techniques can be easily implemented to obtain digital data with lossless compression.

The elimination of the reference ladder in Flash ADCs enabled the reconfiguration of the topology to mimic a tree-like topology. The SAT ADC discussed above, using dynamic StrongARM comparators, was shown to outperform Flash and SAR ADCs in terms of circuit design simplicity, energy consumption, and conversion time. The improvements in performance, energy consumption and encoding circuit are complemented by the reduction in the kickback noise, simple resolution reconfiguration and compatibility with dynamic encoders.

Figure 15:
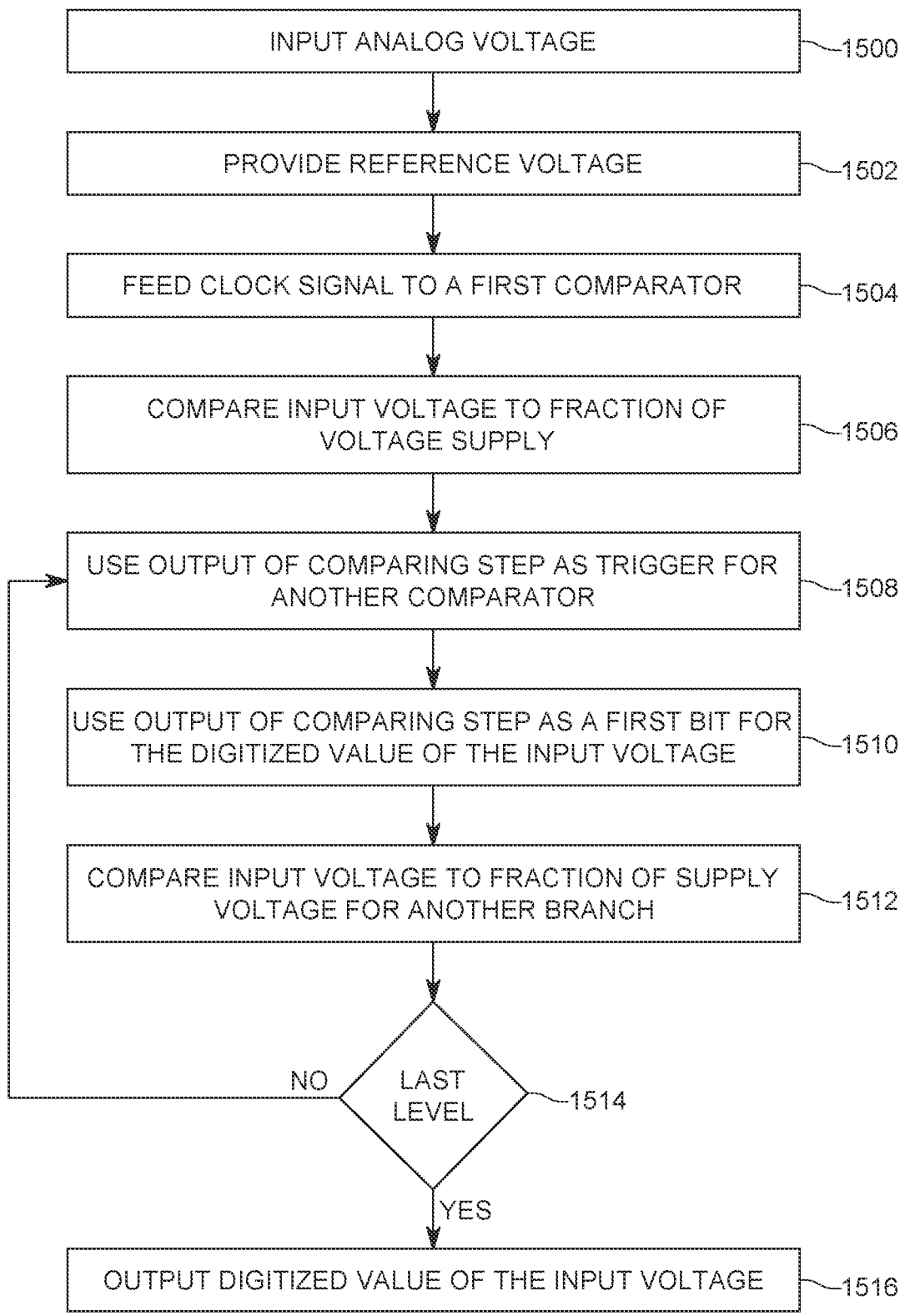
FIG. 15 is a flowchart of a method for digitizing an analog value of a voltage.

A method for digitizing an analog signal with the embodiment illustrated in FIG. 6 or 7A is now discussed with regard to FIG. 15. The method starts in step 1500, in which an analog value of an input voltage Vin is provided to the SAT ADC circuit 600. In step 1502, a reference voltage Vref is provided to the SAT ADC circuit 600. In step 1504, a first comparator, which belongs to a first level of a tree of the SAT ADC circuit 600, receives a clock signal, which triggers the first comparator to compare the input voltage Vin with a first threshold voltage value. The first threshold voltage value is related to the reference voltage Vref and the transistor sizes, but changes from branch to branch and from level to level of the tree. In one application, as shown in FIG. 8, the first threshold voltage value is ½ of the Vdd for the first branch and the first level. However, for the branches of the second level, other values are used. There are as many threshold voltage values as the number of comparators in the circuit, and each comparator has its own unique threshold voltage value. FIG. 8 shows how each threshold voltage value is the product of a fraction F and the Vdd, and the fraction F is smaller than one. The fraction F varies between a maximum value of $$\frac{2^i - 1}{2^i}$$

and a lowest value of $$\frac{1}{2^i},$$

as previously discussed with regard to FIG. 8.

In step 1506, the input voltage Vin is compared to the Vdd times the fraction F. If the input voltage Vin is larger than or equal to the Vdd times the fraction F, then a first output OUT of the first comparator sends in step 1508 a high signal (one) to a first comparator of a next (second) level and a second output OUT' of the first comparator sends a low signal (zero) to a second comparator of the second level. The first and second comparators of the second level are the only comparators of the second level of the tree of the SAT ADC circuit. However, if the input voltage Vin is smaller than the Vdd times the fraction F, then the first output OUT of the first comparator sends in step 1508 a low signal (zero) to the first comparator of the second level and the second output OUT' of the first comparator sends a high signal (one) to the second comparator of the second level. The high value triggers the comparator from the second level of the tree to perform a similar comparison as in step 1506. In step 1510, the output value of the first output OUT of the first comparator is sent to an encoder circuit 640 and this value constitutes the first digit for the digitized value of the input voltage Vin.

Because only one of the first and second comparators of the second level has received a high value (one), only that comparator is triggered in step 1508, and this comparator compares in step 1512 the input voltage Vin with a second threshold value, which is given by the product of the Vdd and a corresponding fraction F (as shown in FIG. 8). From here, the method evaluates in step 1514 whether all the levels of the tree have been considered. If the answer is no, then the method returns to step 1508 and uses the output from a current comparator as a triggering signal for comparators from a next level. In other words, the method repeats the previous steps as one of the comparators of the second level sends a high value to a comparator from a third level and a low value to another comparator from the third level, and this comparator of the second level also sends the output of its OUT terminal as the second bit for the digitized value of the input voltage Vin. The steps are repeated until the last digit of the digitized value of the input voltage Vin is generated. If the answer in step 1514 is yes, then the digitized value of input voltage Vin is output from encoder 640 and the comparison steps are stopped.

Figure 16:
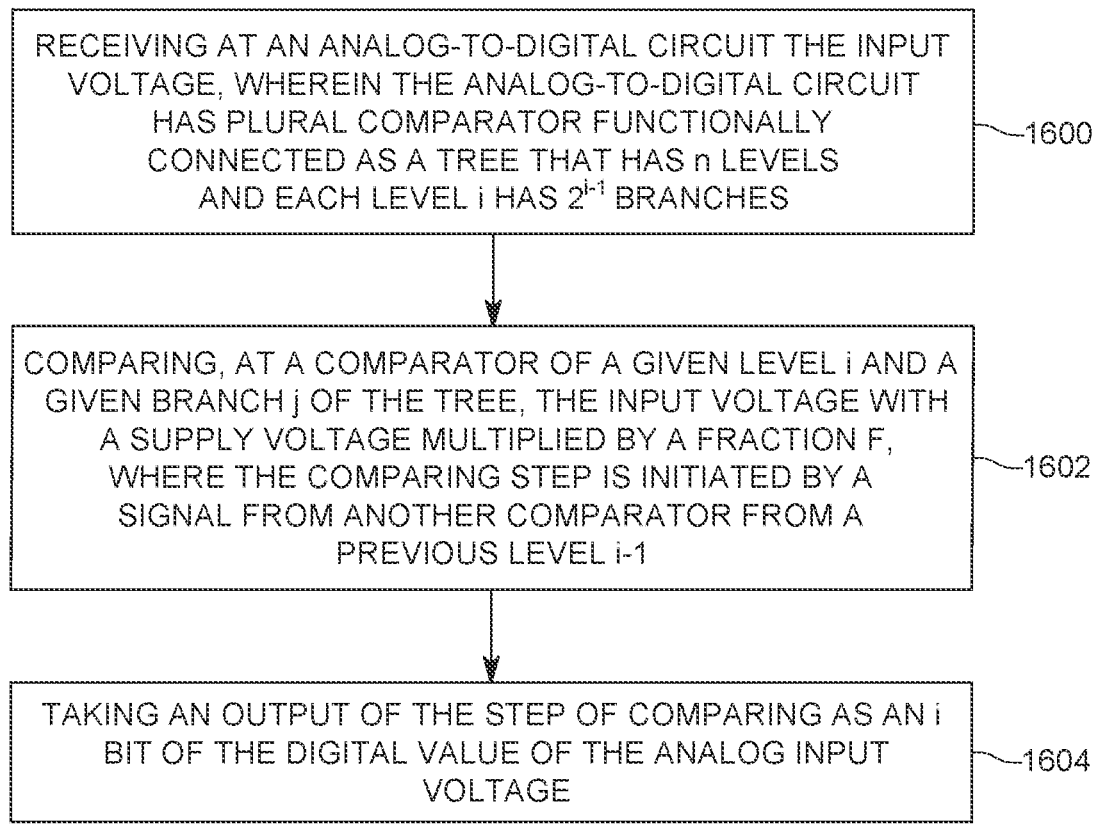
FIG. 16 is a flowchart of another method for digitizing an analog value of a voltage.

A method for digitizing an analog value is now discussed with regard to FIG. 16. The method includes a step 1600 of receiving at an analog-to-digital circuit the input voltage, where the analog-to-digital circuit has plural comparators functionally connected as a tree that has n levels and each level i has $2^{i-1}$ branches, a step 1602 of comparing, at a comparator of a given level i and a given branch j of the tree, the input voltage with a supply voltage multiplied by a fraction F, where the comparing step is initiated by a signal from another comparator from a previous level i−1, and a step 1604 of taking an output of the step of comparing as an i bit of the digital value of the analog input voltage. The method may also include a step of applying the same output as an input to a comparator from a next level i+1 to trigger that comparator, and/or a step of feeding a clock signal only to a first comparator of the tree. The fraction F is given by $$1 - \frac{2j-1}{2^i}$$

for a given level i and a given branch j.

The disclosed embodiments provide a novel configuration for an analog-to-digital circuit that uses less power. The embodiments are intended to cover alternatives, modifications and equivalents, which are included in the spirit and scope of the invention as defined by the appended claims. Further, in the detailed description of the embodiments, numerous specific details are set forth in order to provide a comprehensive understanding of the claimed invention. However, one skilled in the art would understand that various embodiments may be practiced without such specific details.

Although the features and elements of the present embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

REFERENCES

[1] A. S. Almansouri, A. Alturki, H. Fariborzi, K. N. Salama, and T. Al-Attar, "A 12.4fJ-FoM 4-Bit Flash ADC Based on the StrongARM Architecture," in 2018 *14th Conference on Ph.D. Research in Microelectronics and Electronics (PRIME)*, 2018, pp. 37-40.

What is claimed is:

1. An analog-to-digital circuit that digitizes an analog voltage, the analog-to-digital circuit comprising:
    plural comparators functionally connected to form a tree that has levels i, and each level i has branches j; and
    an encoder connected to the plural comparators and configured to generate a digitized value of an input analog voltage,
    wherein each comparator from a level i has first and second outputs, and each of the first and second outputs is electrically connected to an input of different comparators from a next level i+1 of the tree;
    wherein each comparator of each level has three inputs and two outputs, and
    wherein a first output contributes a first signal to an input of a next level comparator and the encoder, and a second output contributes a second signal to an input of another next level comparator.

2. The analog-to-digital circuit of claim 1, wherein the number of branches j for a given level I is equal to $2^{i-1}$.

3. The analog-to-digital circuit of claim 2, wherein there is a single comparator per branch.

4. The analog-to-digital circuit of claim 1, wherein only a comparator of the plural comparators has as input a signal from a clock.

5. The analog-to-digital circuit of claim 1, wherein except for the comparator of the first level I=1, each comparator from a level I has a first input that receives a reference voltage, a second input that receives the input voltage, and a third input that receives an output from a comparator from a previous level i-1.

6. The analog-to-digital circuit of claim 5, wherein a comparator from a level I and a branch j compares the input voltage with the supply voltage multiplied by a fraction F.

7. The analog-to-digital circuit of claim 6, wherein the fraction F is given by $$\frac{2j-1}{2^i}$$

for the given level I and the given branch j.

8. The analog-to-digital circuit of claim 1, wherein a configuration of each comparator of the plural comparators is the same.

9. The analog-to-digital circuit of claim 1, wherein except for a comparator of the first level, each other level has half of the comparators having a same configuration and another half of the comparators having a different configuration.

10. The analog-to-digital circuit of claim 1, wherein each comparator includes 11 transistors.

11. The analog-to-digital circuit of claim 1, wherein the tree has n levels, and the digitized value of the input voltage is described by n bits, one bit from each level.

12. An analog-to-digital circuit that digitizes an analog voltage, the analog-to-digital circuit comprising:
    plural comparators functionally connected to form a tree that has i levels, and each level i has j branches,
    wherein only one comparator of the tree receives a clock signal, and each other comparator from all other levels receives as input the analog voltage, a reference voltage, and a signal from an output of a corresponding comparator from a previous level, and wherein a signal from an output of a comparator from a previous level triggers a comparator from a current level to compare the input voltage to the supply voltage multiplied by a fraction F.

13. The analog-to-digital circuit of claim 12, wherein the fraction F is given by $$1 - \frac{2j-1}{2^i}$$

for a given level i and a given branch j.

14. A method for digitizing an analog input voltage, the method comprising:
receiving at an analog-to-digital circuit the input voltage, wherein the analog-to-digital circuit has plural comparators functionally connected as a tree that has n levels and each level i has $2^{i-1}$ branches;
comparing, at a comparator of a given level i and a given branch j of the tree, the input voltage with a supply voltage multiplied by a fraction F, where the comparing step is initiated by a signal from another comparator from a previous level i-1; and
taking an output of the step of comparing as an i bit of the digital value of the analog input voltage.

15. The method of claim 14, further comprising:
applying the same output as an input to a comparator from a next level i+1 to trigger that comparator.

16. The method of claim 14, further comprising:
feeding a clock signal only to a first comparator of the tree.

17. The method of claim 14, wherein the fraction F is given by $$1 - \frac{2j-1}{2^i}$$

for a given level i and a given branch j.

* * * * *